(12) United States Patent
Kim et al.

(10) Patent No.: US 9,847,459 B2
(45) Date of Patent: Dec. 19, 2017

(54) LIGHT EMITTING DEVICE AND LIGHTING SYSTEM

(71) Applicant: LG INNOTEK CO., LTD., Seoul (KR)

(72) Inventors: Sung Kyoon Kim, Seoul (KR); Min Gyu Na, Seoul (KR); Myeong Soo Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/356,027

(22) Filed: Nov. 18, 2016

(65) Prior Publication Data

US 2017/0069795 A1    Mar. 9, 2017

Related U.S. Application Data

(63) Continuation of application No. 14/930,164, filed on Nov. 2, 2015, now Pat. No. 9,525,109.

(30) Foreign Application Priority Data

Nov. 3, 2014  (KR) .......................... 10-2014-0151308

(51) Int. Cl.
*H01L 33/38*      (2010.01)
*H01L 33/40*      (2010.01)
(Continued)

(52) U.S. Cl.
CPC ............ *H01L 33/387* (2013.01); *H01L 33/06* (2013.01); *H01L 33/08* (2013.01); *H01L 33/12* (2013.01);
(Continued)

(58) Field of Classification Search
None
See application file for complete search history.

(56) References Cited

U.S. PATENT DOCUMENTS 9,236,524 B2 * 1/2016 Jeon ...................... H01L 33/46
9,525,109 B2 * 12/2016 Kim ...................... H01L 33/06
(Continued)

FOREIGN PATENT DOCUMENTS

EP          2 610 928 A2     7/2013
KR   10-2009-0062619 A      6/2009

*Primary Examiner* — Joseph Schoenholtz
(74) *Attorney, Agent, or Firm* — Birch, Stewart, Kolasch & Birch, LLP

(57) ABSTRACT

Disclosed are a light emitting device, a method of manufacturing a light emitting device, a light emitting device package and a lighting system. The light emitting device includes a substrate; a first conductive semiconductor layer on the substrate; an active layer on the first conductive semiconductor layer; a second conductive semiconductor layer on the active layer; a contact layer on the second conductive semiconductor layer; an insulating layer on the contact layer; a first branch electrode electrically connected to the first conductive semiconductor layer; a plurality of first via electrodes connected to the first branch electrode and electrically connected to the first conductive semiconductor layer by passing through the insulating layer; a first pad electrode electrically connected to the first branch electrode; a second pad electrode contacts the contact layer by passing through the insulating layer; a second branch electrode connected to the second pad electrode and disposed on the insulating layer; and a plurality of second via electrodes provided through provided through the insulating layer to electrically connect the second branch electrode to the contact layer.

20 Claims, 8 Drawing Sheets

(51) Int. Cl.
*H01L 33/62* (2010.01)
*H01L 33/12* (2010.01)
*H01L 33/06* (2010.01)
*H01L 33/42* (2010.01)
*H01L 33/14* (2010.01)
*H01L 33/30* (2010.01)
*H01L 33/08* (2010.01)

(52) U.S. Cl.
CPC ............ *H01L 33/145* (2013.01); *H01L 33/30* (2013.01); *H01L 33/382* (2013.01); *H01L 33/385* (2013.01); *H01L 33/405* (2013.01); *H01L 33/42* (2013.01); *H01L 33/62* (2013.01); *H01L 2224/48091* (2013.01)

(56) References Cited

U.S. PATENT DOCUMENTS

2012/0113673 A1* 5/2012 Na .......................... H01L 33/14
362/602
2012/0223359 A1 9/2012 Han
2013/0161585 A1 6/2013 Na et al.

* cited by examiner

LIGHT EMITTING DEVICE AND LIGHTING SYSTEM

CROSS-REFERENCE TO RELATED APPLICATIONS

This application is a Continuation of copending application Ser. No. 14/930,164, filed on Nov. 2, 2015, which claims priority under 35 U.S.C. 119(a) to Korean Patent Application No. 10-2014-0151308 filed on Nov. 3, 2014, which is hereby incorporated by reference in its entirety.

BACKGROUND

The embodiment relates to a light emitting device, a method of manufacturing a light emitting device, a light emitting device package and a lighting system.

A light emitting device (LED) includes a p-n junction diode having a characteristic of converting electric energy into light energy. The p-n junction diode may be formed by combining group III-V elements of the periodic table. The LED may represent various colors by adjusting the compositional ratio of compound semiconductors.

When a forward voltage is applied to an LED, electrons of an n layer are combined with holes of a player, so that energy corresponding to an energy gap between a conduction band and a valance band may be released. The LED emits the energy as the light.

For instance, a nitride semiconductor represents superior thermal stability and wide band gap energy, so that the nitride semiconductor has been spotlighted in the field of optical devices and high-power electronic devices. In particular, blue, green, and UV light emitting devices employing the nitride semiconductor have already been commercialized and extensively used.

A light emitting device may be classified into a lateral type and a vertical type according to the positions of an electrode.

The lateral-type light emitting device among light emitting devices according to the related art is formed in a structure in which a nitride semiconductor layer is formed on a substrate, and two electrode layers are disposed on the nitride semiconductor layer.

Meanwhile, the lateral-type light emitting device according to the related art has a great loss caused at the active layer able to emit light since mesa etching is performed over a large area. In order to compensate for the loss, various attempts are performed to ensure a wider active layer.

For example, according to the related art, there has been an attempt to secure a relatively larger area of an active layer by forming an electrode making contact with a nitride semiconductor layer in a through-electrode type to allow the electrode to be partially and electrically connected to the nitride semiconductor layer so that a removed area of the active area is reduced. However, the related art has a problem in reliability since an operating voltage VF is increased, and thus, the improvement is required.

In addition, according to the related art, the light extraction efficiency may be degraded due to the light absorption of the electrode layer.

SUMMARY

The embodiment is to provide a light emitting device having superior light efficiency and reliability, a method of manufacturing a light emitting device, and a light emitting device package and a lighting system.

In addition, the embodiment is to provide a light emitting device having superior light efficiency and reliability, a method of manufacturing a light emitting device, and a light emitting device package and a lighting system.

To achieve the object, according to the embodiment, there is provided a light emitting device which includes: a substrate 105; a first conductive semiconductor layer 112 on the substrate 105; an active layer 114 on the first conductive semiconductor layer 112; a second conductive semiconductor layer 116 on the active layer 114; an contact layer 120 on the second conductive semiconductor layer 116; an insulating layer 130 on the contact layer 120; a first branch electrode 146 electrically connected to the first conductive semiconductor layer 112; a plurality of first via electrodes 145 connected to the first branch electrode 146 and electrically connected to the first conductive semiconductor layer 112 by passing through the insulating layer 130; a first pad electrode 142 electrically connected to the first branch electrode 146; a second pad electrode 152 contacts the contact layer 120 by passing through the insulating layer 130; a second branch electrode 156 connected to the second pad electrode 152 and disposed on the insulating layer 130; and a plurality of second via electrodes 155 provided through the insulating layer 130 to electrically connect the second branch electrode 156 to the contact layer 120.

In addition, a light emitting device according to the embodiment includes a light emitting structure 110 including a first conductive semiconductor layer 112, an active layer 114 and a second conductive semiconductor layer 116; a first branch electrode 146 electrically connected to the first conductive semiconductor layer 112; a plurality of third via electrodes 149 connected to the first branch electrode 146 and electrically connected to the first conductive semiconductor layer 112 by passing through a predetermined insulating layer 130; a second branch electrode 156 electrically connected to the second conductive semiconductor layer 116 while interposing an contact layer 120 between the second branch electrode 156 and the second conductive semiconductor layer 116; and a plurality of second via electrodes 155 disposed between the second branch electrode 156 and the contact layer 120 while passing through the insulating layer 130.

One of the third via electrodes 149 electrically connected to the first conductive semiconductor layer 112 has a third horizontal width W3 wider than a second horizontal width W of the second via electrode 155 disposed on the contact layer 130.

A light system may include a light emitting unit having a light emitting device.

According to the embodiment, the embodiment can provide a light emitting device having superior light efficiency and reliability, a method of manufacturing a light emitting device, and a light emitting device package and a lighting system.

In addition, according to the embodiment, the embodiment can provide a light emitting device having superior light extraction efficiency and reliability, a method of manufacturing a light emitting device, and a light emitting device package and a lighting system.

DETAILED DESCRIPTION OF THE EMBODIMENTS

In the description of the embodiments, it will be understood that, when a layer (or film), an area, a pattern, or a structure is referred to as being "on" or "under" another substrate, another layer (or film), another area, another pad, or another pattern, it can be "directly" or "indirectly" over the other substrate, layer (or film), area, pad, or pattern, or one or more intervening layers may also be present. Such a position of the layer has been described with reference to the drawings.

Embodiment

Figure 1:
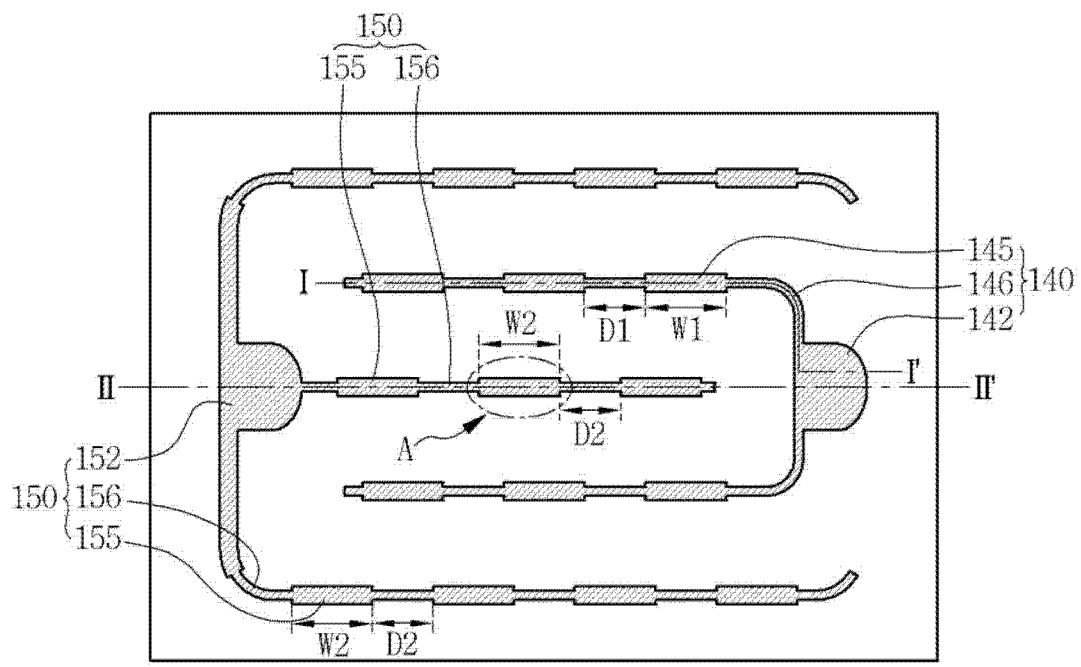
FIG. 1 is a plan view showing a light emitting device according to a first embodiment.
Figure 2:
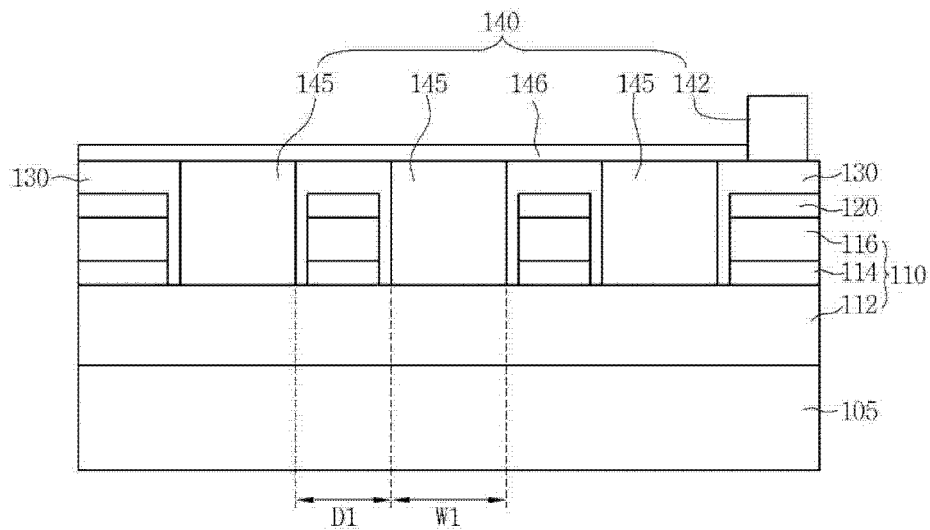
FIG. 2 is a first sectional view taken along line I-I' of FIG. 1.
Figure 4:
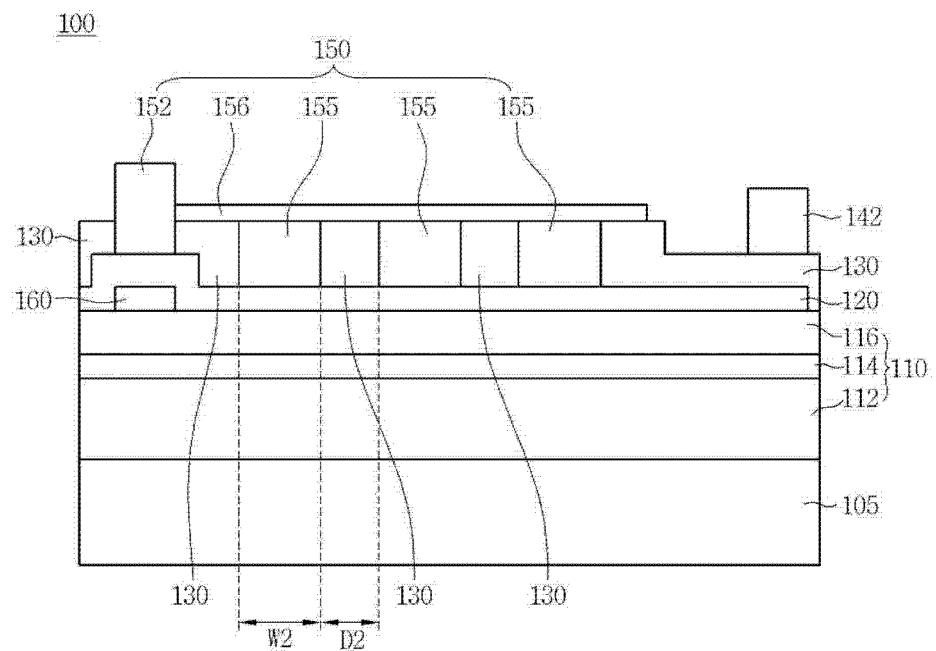
FIG. 4 is a second sectional view taken along line II-II' of FIG. 1.

FIG. 1 is a plan view showing a light emitting device 100 according to a first embodiment. FIG. 2 is a first sectional view taken along line I-I' of FIG. 1. FIG. 4 is a second sectional view taken along line II-II' of FIG. 1.

As shown in FIG. 2, a light emitting device 100 according to the first embodiment may include a substrate 105, a first conductive semiconductor layer 112 formed on the substrate 105, an active layer 114 formed on the first conductive semiconductor layer 112, and a second conductive semiconductor layer 116 formed on the active layer 114. The first and second conductive semiconductor layers 112 and 116 and the active layer 114 may constitute a light emitting structure 110.

In addition, as shown in FIG. 2, the light emitting device 100 according to the first embodiment may include an contact layer 120 formed on the second conductive semiconductor layer 116, an insulating layer 130 formed on the contact layer 120, a first branch electrode 146 electrically connected to the first conductive semiconductor layer 112, and a first pad electrode 142 connected to the first branch electrode 146 so that the first pad electrode 142 is electrically connected to the first conductive semiconductor layer 112.

In addition, the light emitting device 100 according to the first embodiment may include a plurality of first via electrodes 145 which are connected to the first branch electrode 146 and pass through the insulating layer 130 such that the first via electrodes 145 are electrically connected to the first conductive semiconductor layer 112.

A first electrode 140 may include the first pad electrode 142, the first branch electrode 146 and the first via electrodes 145.

As shown in FIG. 4, the light emitting device 100 according to the first embodiment may include a second pad electrode 152 passing through the insulating layer 130 to make contact with an contact layer 120, a second branch electrode 156 disposed on the insulating layer 130 while being connected to the second pad electrode 152, and a second via electrode 155 interposed between the second branch electrode 156 and the contact layer 120 while passing through the insulating layer 130.

A second electrode 150 may include the second pad electrode 152, the second branch electrode 156 and the second via electrode 155.

Figure 3:
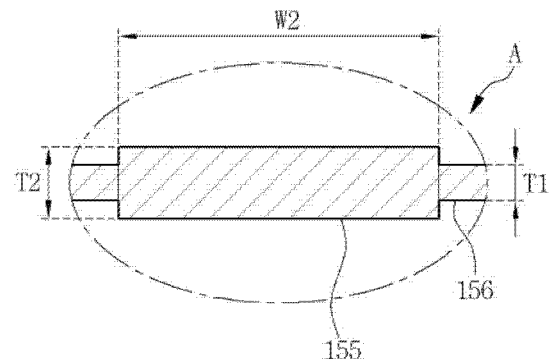
FIG. 3 is an enlarged view of part A of FIG. 1.

Hereinafter, the characteristics of the light emitting device 100 according to an embodiment will be described with reference to FIGS. 2a and 3. Although the lateral-type light emitting device according to the first embodiment is shown in FIGS. 1, 2a and 3, the embodiment is not limited thereto.

According to the first embodiment, the substrate 105 may include an insulating substrate or a conductive substrate. For example, the substrate 105 may include at least one of sapphire ($Al_2O_3$), SiC, Si, GaAs, GaN, ZnO, GaP, InP, Ge, and $Ga_2O_3$, or the combination thereof, but the embodiment is not limited thereto. A predetermined concave-convex structure (not shown) may be formed on the substrate 105 to improve light extraction efficiency, but the embodiment is not limited thereto.

According to the first embodiment, a predetermined buffer layer (not shown) is formed on the substrate 105 to reduce lattice mismatch between the light emitting structure 110 and the substrate 105. The buffer layer may include at least one of GaN, InN, AlN, InGaN, AlGaN, InAlGaN, and AlInN, but the embodiment is not limited thereto.

According to the first embodiment, the light emitting device 100 may include the light emitting structure 110 formed on the substrate 105 or the buffer layer. The light emitting structure 110 may include the first conductive semiconductor layer 112 on the substrate 105, the active layer 114 on the first conductive semiconductor layer 112, and the second conductive semiconductor layer 116 on the active layer 114.

The first conductive semiconductor layer 112 may be realized using a group III-V compound semiconductor doped with first conductive dopants. For example, when the first conductive semiconductor layer 112 is an N type semiconductor layer, the first conductive dopants may include Si, Ge, Sn, Se, and Te serving as N type dopants, but the embodiment is not limited thereto.

The first conductive semiconductor 112 may include a semiconductor material having a composition formula of $In_xAl_yGa_{1-x-y}N$ ($0 \leq x \leq 1$, $0 \leq y \leq 1$, $0 \leq x+y \leq 1$). For example, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

In the active layer 114, electrons injected through the first conductive semiconductor layer 112 and holes injected through the second conductive semiconductor layer 116 thereafter meet each other, so that light having energy determined by the inherent energy band of a material constituting the active layer (light emission layer) is emitted.

The active layer 114 may include at least one of a single quantum well, a multi-quantum well (MQW), a quantum-wire structure, and a quantum dot structure.

The active layer 114 may have a well layer/barrier layer. For example, the active layer 114 may be formed in a pair structure having at least one of InGaN/GaN, InGaN/InGaN, GaN/AlGaN, InAlGaN/GaN, GaAs/AlGaAs, GaP/AlGaP, InGaAs/AlGaAs and InGaP/AlGaP, but the embodiment is not limited thereto. The well layer may include a material having a bandgap lower than that of the barrier layer.

According to the first embodiment, an electron blocking layer (not shown) may be formed on the active layer 114. For example, the electron blocking layer may include a semiconductor based on $Al_xIn_yGa_{(1-x-y)}N$ (0≤x1, 0≤y≤1), and may have the energy bandgap higher than that of the active layer 114. The electron blocking layer 160 is implanted with P type ions to effectively block overflowed electrons, so that hole injection efficiency may be increased.

According to the embodiment, the second conductive semiconductor layer 116 may include a group III-V compound semiconductor layer doped with second conductive dopants. For example, the second conductive semiconductor layer 116 may include a semiconductor material having a composition formula of $In_xAl_yGa_{1-x-y}N$ (0≤x≤1, 0≤y≤1, 0≤x+y≤1). When the second conductive semiconductor layer 116 includes a P type semiconductor layer, the second conductive dopant may include Mg, Zn, Ca, Sr, or Ba serving as the second conductive dopant.

As shown in FIG. 2a, according to the first embodiment, the light emitting device 100 may include the contact layer 120 on the second conductive semiconductor layer 116, the insulating layer 130 on the contact layer 120, the first branch electrode 146 electrically connected with the first conductive semiconductor layer 112, the first via electrodes 145 connected with the first branch electrode 146 and passing through the insulating layer 130 to be electrically connected to the first conductive semiconductor layer 112, and the first pad electrode 142 connected with the first branch electrode 140 so that the first pad electrode 142 is electrically connected to the first conductive semiconductor layer 112.

The contact layer 120 may be formed by multi-layering single metal, a metal alloy, and a metallic oxide so that carriers may be efficiently implanted. The contact layer 120 includes a transmissive electrode to improve the light extraction efficiency and to lower the operating voltage, so that the reliability may be improved.

For example, the contact layer 120 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ ITO, Ag, Ni, Cr, Ti, Al, Rh, Pd, Ir, Ru, Mg, Zn, Pt, Au, and Hf, or the combination thereof, but the embodiment is not limited thereto.

The insulating layer 130 may include an electrical insulator including an oxide or a nitride, but the embodiment is not limited thereto. The insulating layer 130 may perform a short protection function. For example, the insulating layer 130 may be interposed between the first via electrode 145, the contact layer 120, the second conductive semiconductor layer 116 and the active layer 114, so that the first via electrode 145, the contact layer 120, the second conductive semiconductor layer 116 and the active layer 114 are prevented from being short circuited with each other.

The insulating layer 130 is formed of a transmissive insulating material so that the light extraction efficiency may be improved.

As shown in FIG. 2, according to the first embodiment, the active layer 114 is not mesa-etched at the position in which the first pad electrode 142 is formed, thereby securing an active layer region to improve internal light emission efficiency, and to improve light efficiency due to current spreading.

Thus, according to the first embodiment, the first pad electrode 142 is disposed on the insulating layer 130, so that the first pad electrode 142 may be connected to the first branch electrode 146. The first pad electrode 142 may vertically overlap the insulating layer 130 and the contact layer 120. The contact layer 120 is provided under the first pad electrode 142 while interposing the insulating layer 130 between the contact layer 120 and the first pad electrode 142, thereby widening a light emission area to improve carrier injection efficiency, so that light efficiency may be improved.

According to the first embodiment, as shown in FIG. 2, the contact layer 120, the second conductive semiconductor layer 116 and the active layer 114 are partially removed through the mesa-etching process, so that the first conductive semiconductor layer 112 may be partially exposed.

The first branch electrode 146 may be electrically connected to the exposed first conductive semiconductor layer 112.

According to the first embodiment, an N type branch electrode structure sufficiently secures a contact area with an N type semiconductor layer to prevent the operating voltage from being increased so that the reliability of the device may be improved. The P type branch electrode employs a point contact structure to contribute to current spreading. The second conductive semiconductor layer 116 makes contact with the contact layer 120 to prevent the operating voltage from being increased, so that the reliability and the light emission efficiency of the device may be maximized.

To this end, according to the first embodiment, as shown in FIGS. 1 and 2a, the first horizontal width W1 of one of the first via electrodes 145 electrically connected to the first conductive semiconductor layer 112 is longer than the first distance D1 between the first via electrodes 145, so that the area, in which the first via electrode 145 is electrically connected to the first conductive semiconductor layer 112, may be sufficiently secured, thereby preventing the operating voltage from being increased to improve the reliability of the light emitting device.

In addition, according to the second embodiment, as shown in FIG. 4, the second horizontal width W2 of one of the second via electrodes 155 electrically connected to the contact layer 120 is longer than the second distance D2 between the second via electrodes 155, so that the area, in which the second via electrode 155 is electrically connected to the contact layer 120, may be sufficiently secured, thereby preventing the operating voltage from being increased to improve the reliability of the light emitting device.

Table 1 shows the electrical characteristics of an embodiment example and a comparative example for comparison.

TABLE 1

|  | Po (mW) | Vf (V) | Current (mA) | WPE (%) |
|---|---|---|---|---|
| Embodiment example | 107.0 | 2.847 | 65 | 57.82 |
| Comparative example | 102.84 | 2.864 | 65 | 55.24 |

As shown in Table 1, according to the first embodiment, a first horizontal width W1 of one of the first via electrodes 145 electrically connected to the first conductive semiconductor layer 112 is set to be longer than a first distance D1 between the first via electrodes 145, and a second horizontal width W2 of one of the second via electrodes 155 electrically connected to the contact layer 120 is set to be longer than a first distance D2 between the second via electrodes 155. According to the comparative example, the horizontal width of a via electrode of a light emitting device to which a point contact is applied is substantially equal to a distance between the via electrodes.

As described above, according to the related art, an attempt to secure a wider active layer is performed based on the electrical connection with the nitride semiconductor layer through a via electrode. However, the related art has a problem in reliability since the operating voltage VF is increased.

As shown in Table 1, when the first embodiment is applied, as compared with the related art, the operating voltage VF is reduced, so that the reliability is improved. In addition, the intensity of light (Po) is increased from 102.84 mW to 107 mW, so that the wall-plug efficiency (WPE) is increased by about 2.5% from 55.24% to 57.82%.

Meanwhile, in case of a point contact structure according to the related art, an issue of increasing the operating voltage by varying a metal layer according to a partial contact has been raised.

Figure 5:
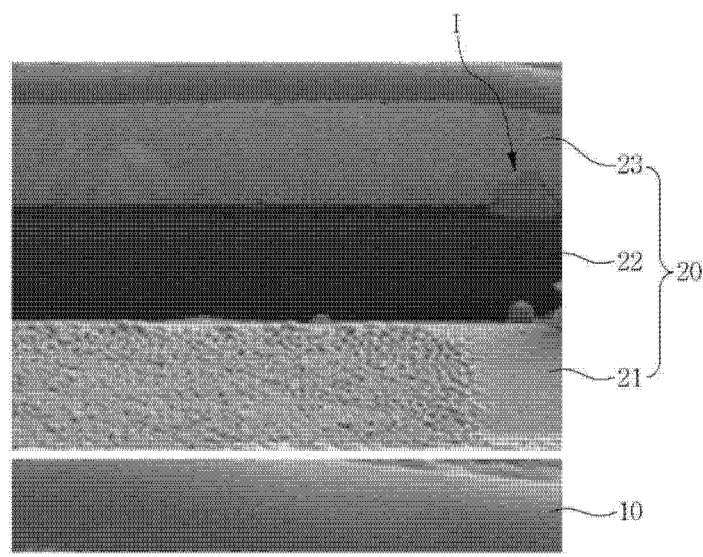
FIG. 5 is a photograph of a part of a light emitting device according to the related art.

For example, FIG. 5 is a photo of a light emitting device according to the related art, where a light emitting structure 10 according to the related art includes a GaN layer, and an electrode layer 20 includes a Cr layer 21, an Al layer 22 and a Ni layer 23.

According to the related art, when the electrode layer 20 is formed on the light emitting structure 10, as temperature is increased, inter metallic compounds I are generated, so that the electrode layer 20 is brittle and the operating voltage is increased, thereby raising an issue in electrical reliability.

According to the first embodiment, the first horizontal width W1 of one of the first via electrodes 145 electrically connected to the first conductive semiconductor layer 112 is controlled to be longer than the first distance D1 between the first via electrodes 145, so that the electrical contact area with the first conductive semiconductor layer 112 may be sufficiently secured. Thus, the center current crowding of the light emitting device may be minimized so that the light efficiency is improved. In addition, the electrical reliability may be improved so that the light efficiency is improved.

According to the first embodiment, the first horizontal width W1 of the first via electrode 145 electrically connected to the first conductive semiconductor layer 112 may be 2.5 times or more of the first distance D1 between the first via electrodes 145.

For example, according to the first embodiment, the first horizontal width W1 of one of the first via electrodes 145 may be equal to or more than about 50 μm and the first distance D1 between the first via electrodes 145 may be about 20 μm, but the embodiment is not limited thereto. When the first horizontal width W1 of one of the first via electrodes 145 is less than about 50 μm, due to current crowding, the operating voltage Vf may be increased to exert an influence on the reliability.

For example, the first embodiment, the first horizontal width W1 of one of the first via electrodes 145 may be in the range of about 50 μm to about 70 μm and the first distance D1 between the first via electrodes 145 may be in the range of about 15 μm to 25 μm, but the embodiment is not limited thereto.

Although the horizontal width of the via electrode of the comparative example shown in Table 1 is about 20 μm, the first horizontal width W1 of the first via electrode 145 according to the first embodiment is controlled to be in the range of about 50 μm to about 70 μm, preferably, about 54 μm to about 66 μm, so that the electrical contact area with the first conductive semiconductor layer 112 may be sufficiently secured to minimize the center current crowding of the light emitting device chip, thereby improving the electrical reliability as well as the light efficiency.

As the comparative example, when the horizontal width of the via electrode is approximate to the distance between the via electrodes, the contact area between the first conductive semiconductor layer and the via electrode is insufficient to secure significant light intensity and electrical reliability.

FIG. 3 is an enlarged view of part A of FIG. 1.

Referring to FIGS. 1 to 3, according to the embodiment, when viewed from the top, a second thickness T2 of one of the second via electrodes 155 making contact with the contact layer 120 is thicker than a first thickness T1 of the second branch electrode 156, so that the area substantially making contact with the contact layer 120 is widely secured and the remaining areas are set to be narrow. Thus, the electrical reliability may be improved and. degradation of the light extraction efficiency, which may be caused as the emitted light is reflected or blocked by the branch electrode, can be prevented.

For example, when a high current is applied and the second thickness T2 of one of the second via electrode 155 is relatively enlarged when viewed from the top, the electrical reliability may be improved.

Although not shown in any drawings, the first electrode 140 may employ technical properties of the second electrode 150 including the second branch electrode 156 having the first thickness T1 and the second via electrode 155 having the second thickness T2.

Figure 6:
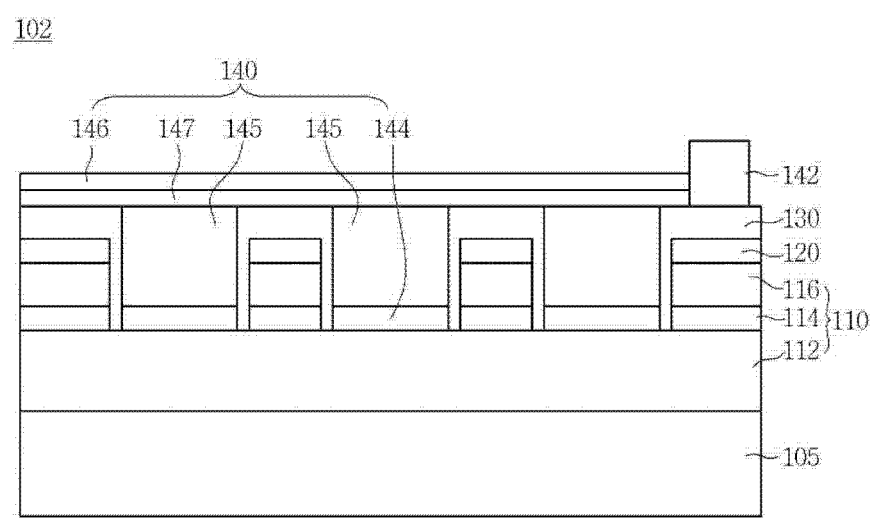
FIG. 6 is a third sectional view taken along line I-I of FIG. 1 according to a second embodiment.
Figure 7:
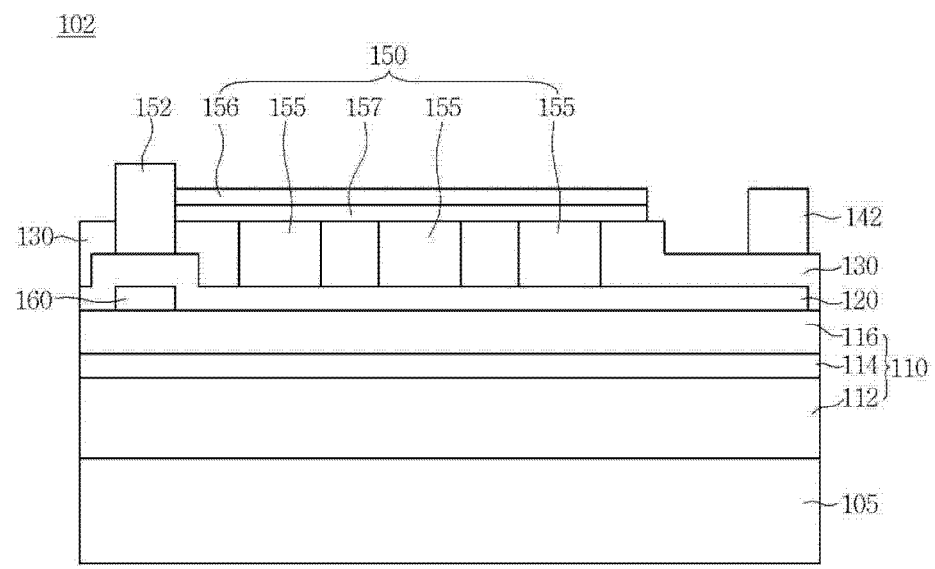
FIG. 7 is a fourth sectional view taken along line II-II' of FIG. 1 according to the second embodiment.

FIG. 6 is a third sectional view of a light emitting device 102 taken along line I-I' of FIG. 1 according to a second embodiment. FIG. 7 is a fourth sectional view of a light emitting device taken along line II-II' of FIG. 1 according to the second embodiment.

As shown in FIG. 6, according to the second embodiment, the first electrode 140 may include a first contact branch electrode 144 making contact with the first conductive semiconductor layer 112 and a first reflective branch electrode 147 disposed on the first via electrode 145.

According to the second embodiment, by employing the first contact branch electrode 144 making contact with the first conductive semiconductor layer 112, the contact property between the first via electrode 145 and the first conductive semiconductor layer 112 may be secured at the maximum, so that the operating voltage is reduced to improve the electrical reliability.

For example, the first contact branch electrode 144 may include at least one of Cr, Ni, Ti, Rh, Pd, Ir, Ru, Pt, Au and Hf, or the combination thereof, but the embodiment is not limited thereto.

In addition, according to the embodiment, the first reflective branch electrode 147 is provided at a lower portion of the first branch electrode 146, so that the light absorption by the first branch electrode 146 may be minimized, thereby improving the external light extraction efficiency.

The first reflective branch electrode 147 may include at least one of Ag, Al, Ni, Ti, Rh, Pd, Ir, Ru, Mg, Zn, Pt, Au, and Hf, or the combination thereof, but the embodiment is not limited thereto.

The first reflective branch electrode 147 may be formed in a multi-layered structure, but the embodiment is not limited thereto. For example, if the first reflective branch electrode 147 is formed to have two layers, the first reflective branch electrode 147 may include Al/Ni or Ag/Ni. If the first reflective branch electrode 147 is formed to have a single layer, the first reflective branch electrode 147 may include a distributed bragg reflector (DBR), but the embodiment is not limited thereto.

In addition, as shown in FIG. 7, the second electrode 150 according to the second embodiment may include the second reflective branch electrode 157 which is provided at an lower portion of the second branch electrode 156, so that the light absorption by the second branch electrode 156 may be minimized, thereby improving the external light extraction efficiency.

The second reflective branch electrode 157 may include at least one of Ag, Al, Ni, Ti, Rh, Pd, Ir, Ru, Mg, Zn, Pt, Au, and Hf, or the combination thereof, but the embodiment is not limited thereto. The second reflective branch electrode 157 may be formed in a multi-layered structure, but the embodiment is not limited thereto.

Figure 8:
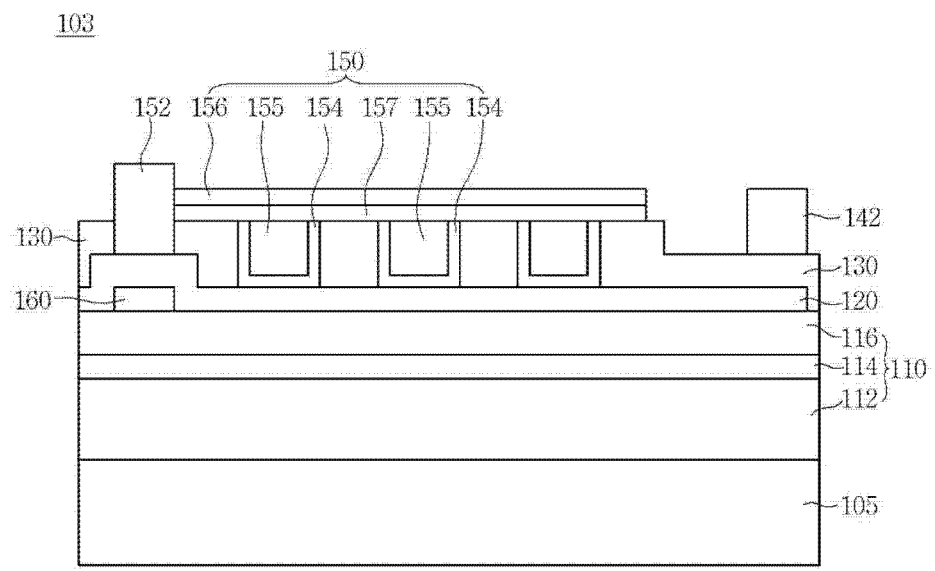
FIG. 8 is a fifth sectional view taken along line II-II' of FIG. 1 according to a third embodiment.

FIG. 8 is a fifth sectional view taken along line II-II' of FIG. 1 according to a third embodiment.

According to the third embodiment, the second electrode 150 may include a second reflective via electrode 154 at an outside of the second via electrode 155.

The second reflective via electrode 154 may be interposed between the contact layer 120 and the second via electrode 155. The second reflective via electrode 154 may surround the side surface of the second via electrode 155, but the embodiment is not limited thereto.

According to the third embodiment, since the second reflective via electrode 154 is provided to the outside of the second via electrode 155, the light absorption by the second via electrode 155 may be minimized.

Figure 9:
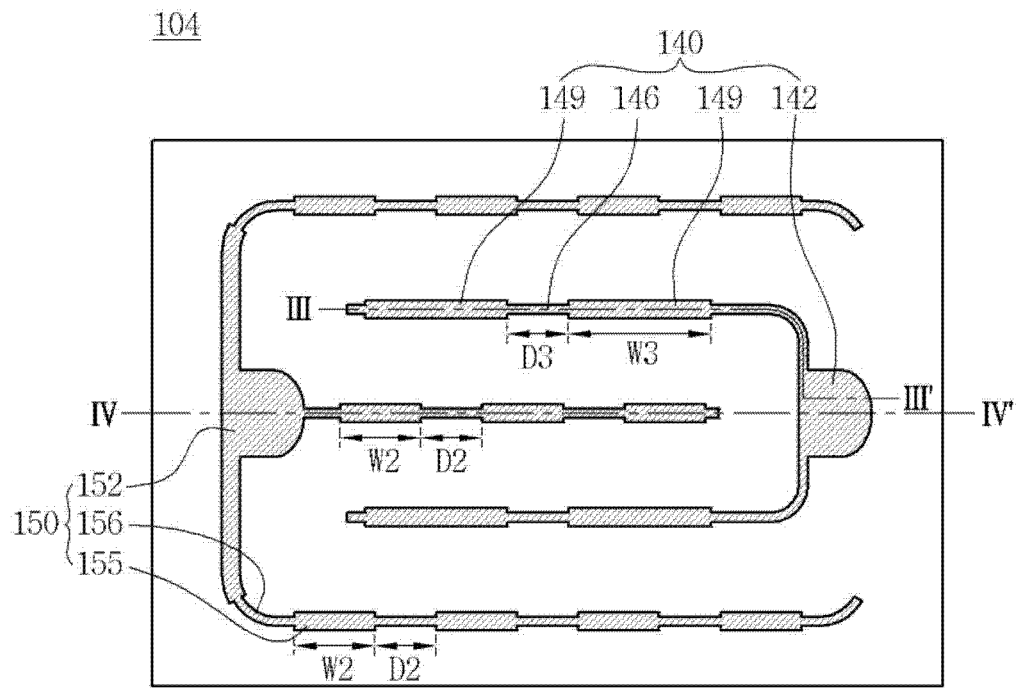
FIG. 9 is a plan view showing a light emitting device according to a fourth embodiment.
Figure 10:
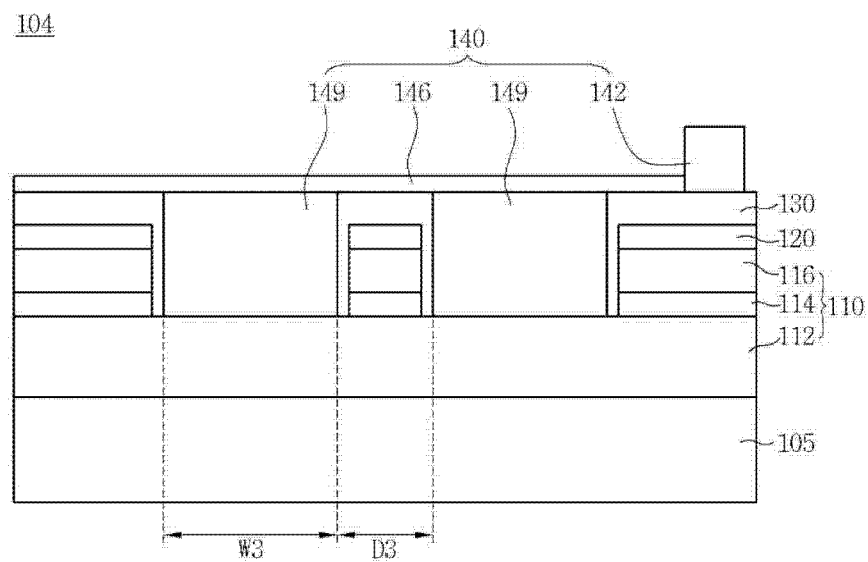
FIG. 10 is a sixth sectional view taken along line III-III' of FIG. 9.
Figure 11:
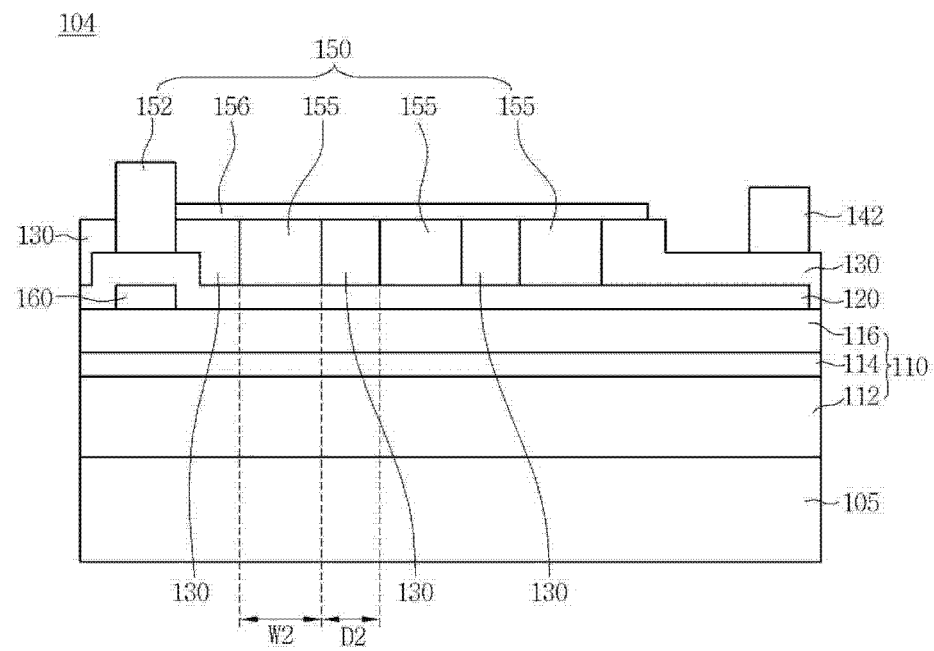
FIG. 11 is a seventh sectional view taken along line IV-IV' of FIG. 9.

FIG. 9 is a plan view showing a light emitting device according to a fourth embodiment. FIG. 10 is a sixth sectional view taken along line III-III' of FIG. 9. FIG. 11 is a seventh sectional view taken along line IV-IV' of FIG. 9.

The light emitting device 104 according to the fourth embodiment may include a light emitting structure 110 including a first conductive semiconductor layer 112, an active layer 114 and a second conductive semiconductor layer 116, a first branch electrode 146 electrically connected to the first conductive semiconductor layer 112, a plurality of third via electrodes 149 connected to the first branch electrode 146 and electrically connected to the first conductive semiconductor layer 112 by passing through a predetermined insulating layer 130, a second branch electrode 156 electrically connected to the second conductive semiconductor layer 116 while interposing an contact layer 120 therebetween, and a plurality of second via electrodes 155 disposed between the second electrode 156 and the contact layer 120 while passing through the insulating layer 130.

The fourth embodiment may employ technical properties of the first to third embodiments.

As shown in FIG. 9, according to the fourth embodiment, the third horizontal width W3 of one of the third via electrodes 149 electrically connected to the first conductive semiconductor layer 112 may be greater than the second horizontal width W2 of the second via electrode disposed on the contact layer 130.

According to the fourth embodiment, the third horizontal width W3 of the third via electrode 149 electrically connected to the first conductive semiconductor layer 112 is controlled to be greater than the second horizontal width W2 of the second via electrode 155 electrically connected to the contact layer 120, so that the area of the third via electrode 149 making electrical contact with the first conductive semiconductor layer 112 may be sufficiently secured on the central portion of a chip of which the current crowding is greatly issued. Thus, the center current crowding of the central portion may be minimized so that the light efficiency is improved. In addition, the electrical reliability may be improved so that the light efficiency is improved.

In addition, as shown in FIG. 9, according to the fourth embodiment, the third horizontal width W3 of the third via electrode 149 connected to the first branch electrode 146 may be about three times or more of a third distance D3 between the third via electrodes 149. Thus, the third via electrodes 149 may be disposed to the first branch electrodes 146 by assigning two third via electrodes 149 to one first branch electrode 146.

According to the fourth embodiment, the third distance D3 between the third via electrodes 149 may be longer than the second distance D2 between the second via electrodes 155 for the purpose of current spreading. For example, the third distance D3 between the third via electrodes 149 may be secured to be about 100 µm or more for the purpose of current spreading so that current crowding may be prevented and the electrical reliability may be ensured due to current spreading.

According to the fourth embodiment, the area of the third via electrode 149 making electrical contact with the first conductive semiconductor layer 112 may be sufficiently secured to prevent the operating voltage from being increased, so that the reliability of a light emitting device may be more improved.

Figure 12:
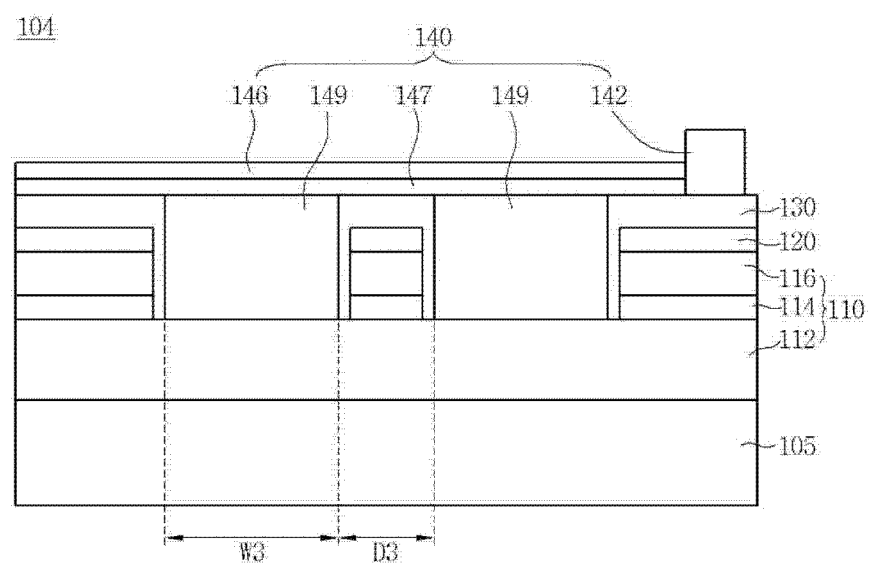
FIG. 12 is an eighth sectional view taken along line III-III' of FIG. 9.

FIG. 12 is an eighth sectional view taken along line III-III' of FIG. 9.

As shown in FIG. 12, the first electrode 140 of the light emitting device according to the fourth embodiment may include the third reflective branch electrode 147 which is provided at an lower portion of the first branch electrode 146, so that the light absorption by the first branch electrode 146 may be minimized, thereby improving the external light extraction efficiency.

The third reflective branch electrode 147 may include at least one of Ag, Al, Ni, Ti, Rh, Pd, Ir, Ru, Mg, Zn, Pt, Au, and Hf, or the combination thereof, but the embodiment is not limited thereto. The third reflective branch electrode 147 may be formed in a multi-layered structure, but the embodiment is not limited thereto.

According to the embodiment, the embodiment can provide a light emitting device having superior light efficiency and reliability, a method of manufacturing a light emitting device, and a light emitting device package and a lighting system.

In addition, according to the embodiment, the embodiment can provide a light emitting device having superior light extraction efficiency and reliability, a method of manufacturing a light emitting device, and a light emitting device package and a lighting system.

Figure 13:
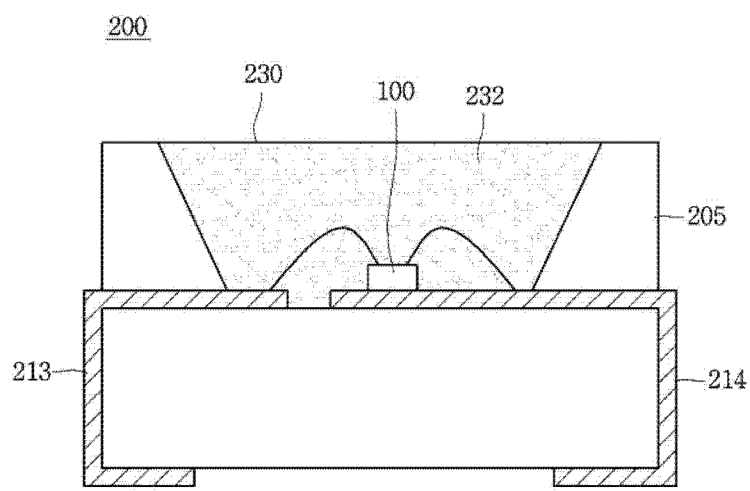
FIG. 13 is a sectional view showing a light emitting device package according to an embodiment.

FIG. 13 is a sectional view showing a light emitting device package in which the light emitting device according to an embodiment is mounted.

The light emitting device package according to an embodiment may include a package body part 205, third and fourth electrode layers 213 and 214 mounted on the package body part 205, a light emitting device 100 mounted on the package body part 205 and electrically connected with the third and fourth electrode layers 213 and 214, and a molding member 230 having phosphor 232 and surrounding the light emitting device 100.

The third and fourth electrode layers 213 and 214 are electrically isolated from each other to supply power to the light emitting device 100. In addition, the third and fourth electrode layers 213 and 214 reflect light emitted from the light emitting device 100 to improve light efficiency, and emitting heat generated from the light emitting device 100 to an outside.

The light emitting device 100 may be electrically connected with the third electrode layer 213 and/or the fourth electrode layer 214 through one of a wire scheme, a flip-chip scheme and a die-bonding scheme.

Figure 14:
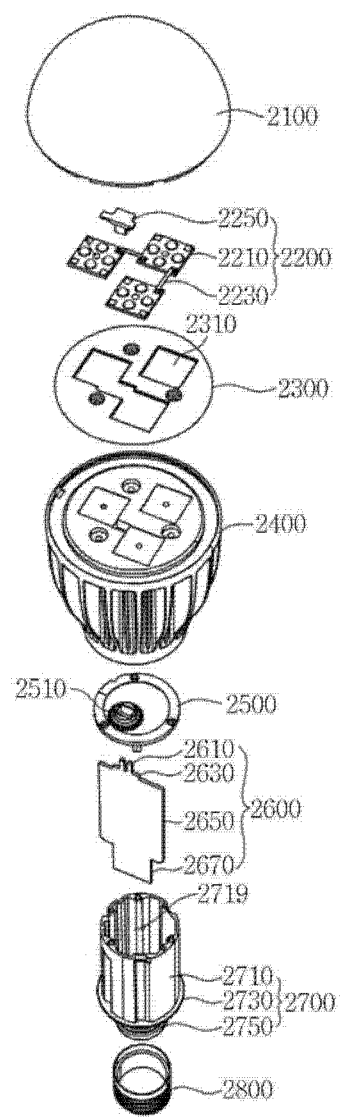
FIG. 14 is a perspective views showing a lighting apparatus according to an embodiment.

FIG. 14 is an exploded perspective of a lighting system according to an embodiment.

The lighting system according to the embodiment may include a cover 2100, a light source module 2200, a heat radiation member 2400, a power supply unit 2600, an internal case 2700, and a socket 2800. In addition, the lighting system according to the embodiment may further include at least one of a member 2300 and a holder 2500. The light source module 2200 may include the light emitting device or the light emitting device package according to the embodiment.

The light source module 2200 may include a light source unit 2210, a connection plate 2230, and a connector 2250. The member 2300 is provided on a top surface of the heat radiation member 2400, and has a guide groove 2310 into which a plurality of light source units 2210 and the connector 2250 are inserted.

The holder 2500 closes a receiving groove 2719 of an insulating part 2710 provided in the internal case 2700. Accordingly, the power supply unit 2600, which is received in the insulating part 2710 of the internal case 2700, is sealed. The holder 2500 has a guide protrusion part 2510.

The power supply unit 2600 may include a protrusion part 2610, a guide part 2630, a base 2650, and an extension part 2670. The inner case 2700 may include a molding part together with the power supply unit 2600. The molding part is formed by hardening a molding solution to fix the power supply unit 2600 to an inner part of the internal case 2700.

A plurality of light emitting device packages according to the embodiment are arrayed on a substrate, and a light guide plate, a prism sheet, a diffusion sheet and a fluorescent sheet serving as optical members may be disposed on a path of light emitted from the light emitting device packages.

The light emitting device according to the embodiment may be applied to a backlight unit, a lighting unit, a display device, an indicator, a lamp, a street lamp, a vehicle lighting device, a vehicle display device, a smart clock, and the like, but the embodiment is not limited thereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a first conductive semiconductor layer;
an active layer on the first conductive semiconductor layer;
a second conductive semiconductor layer on the active layer;
a first electrode on the first conductive semiconductor layer;
a second electrode on the second conductive semiconductor layer;
a contact layer under the second electrode; and
an electron blocking layer under the contact layer,
wherein the first electrode comprises a first branch electrode electrically connected to the first conductive semiconductor layer and a plurality of first via electrodes connected to the first branch electrode,
wherein the second electrode comprises a second branch electrode electrically connected to the second conductive semiconductor layer and spaced apart from the contact layer in the vertical direction and a plurality of second via electrodes connected to the second branch electrode, and
wherein one of the first via electrodes has a first horizontal width greater than a second horizontal width of one of the second via electrodes.

2. The light emitting device of claim 1, further comprising an insulating layer on the contact layer,
wherein the second electrode comprises:
a second pad electrode contacting the contact layer; and
the plurality of second via electrodes between the second branch electrode and the contact layer, and
wherein the second branch electrode has a first area contacting the second via electrode and a second area contacting the insulating layer, the first area being different from the second area.

3. The light emitting device of claim 2, wherein the second pad electrode is vertically overlapped with the electron blocking layer, and
wherein the electron blocking layer has a first size identical to a second size of the second pad electrode.

4. The light emitting device of claim 2, wherein the second horizontal width is longer than a second distance between the second via electrodes.

5. The light emitting device of claim 4, wherein the second horizontal width of one of the second via electrodes is 2.5 times or more of the second distance between the second via electrodes.

6. The light emitting device of claim 4, wherein the second horizontal width is in a range of about 50 μm to about 70 μm.

7. The light emitting device of claim 4, wherein the second distance is in a range of about 15 μm to about 25 μm.

8. The light emitting device of claim 2, wherein one of the second via electrodes has a second thickness thicker than a first thickness of the second branch electrode.

9. The light emitting device of claim 2, further comprising a reflective branch electrode under the second branch electrode.

10. The light emitting device of claim 2, further comprising a reflective via electrode between the second via electrodes and the contact layer,
wherein the insulating layer surrounds the respective via electrodes.

11. The light emitting device of claim 10, wherein the reflective via electrode surrounds a side surface of the second via electrodes.

12. The light emitting device of claim 2,
wherein the second pad electrode contacts the contact layer by passing through the insulating layer.

13. The light emitting device of claim 12, wherein the first electrode comprises:
a first pad electrode on the insulating layer,
wherein the plurality of first via electrodes are electrically connected to the first conductive semiconductor layer by passing through the insulating layer, and
wherein the first branch electrode has a first area contacting the first via electrode and a second area contacting the insulating layer, the first area being different from the second area.

14. The light emitting device of claim 13, wherein one of the second via electrodes has a second thickness greater than a first thickness of the second branch electrode,
wherein the first horizontal width is longer than a first distance between the first via electrodes,
wherein the first horizontal width of one of the first via electrodes is 2.5 times or more of the first distance between the first via electrodes,
wherein the first horizontal width is in a range of about 50 μm to about 70 μm, and
wherein the first distance is in a range of about 15 μm to about 25 μm.

15. A light emitting device comprising:
a substrate;
a first conductive semiconductor layer on the substrate;
an active layer on the first conductive semiconductor layer;
a second conductive semiconductor layer on the active layer;
a first electrode on the first conductive semiconductor layer;
a second electrode on the second conductive semiconductor layer;
a contact layer under the second electrode; and
an electron blocking layer under the contact layer;
wherein the first electrode comprises a first branch electrode electrically connected to the first conductive semiconductor layer and spaced apart from the contact layer and a plurality of first via electrodes connected to the first branch electrode,
wherein the second electrode comprises a second branch electrode electrically connected to the second conductive semiconductor layer and spaced apart from the contact layer and a plurality of second via electrodes connected to the second branch electrode, and
wherein one of the first via electrodes has a first horizontal width greater than a second horizontal width of one of the second via electrodes.

16. The light emitting device of claim 15, wherein the first electrode comprises:
a first pad electrode contacting the first branch electrode,
wherein the plurality of first via electrodes are between the first branch electrode and the first conductive semiconductor layer, and
wherein the first branch electrode has a first area contacting the first via electrode and a second area contacting the insulating layer, the first area being different from the second area.

17. The light emitting device of claim 16, wherein one of the second via electrodes has a second thickness greater than a first thickness of the second branch electrode,
wherein the first horizontal width is longer than a first distance between the first via electrodes,
wherein the first horizontal width of one of the first via electrodes is 2.5 times or more of the first distance between the first via electrodes,
wherein the first horizontal width is in a range of about 50 μm to about 70 μm, and
wherein the first distance is in a range of about 15 μm to about 25 μm.

18. The light emitting device of claim 15, wherein the second electrode comprises:
a second pad electrode contacting the contact layer,
wherein the plurality of second via electrodes disposed are between the second branch electrode and the contact layer,
wherein the second pad electrode is vertically overlapped with the electron blocking layer,
wherein the second horizontal width is longer than a second distance between the second via electrodes,
wherein the second horizontal width of one of the second via electrodes is 2.5 times or more of the second distance between the second via electrodes,
wherein the second horizontal width is in a range of about 50 μm to about 70 μm,
wherein the second distance is in a range of about 15 μm to about 25 μm, and
wherein one of the second via electrodes has a second thickness thicker than a first thickness of the second branch electrode.

19. The light emitting device of claim 18, further comprising a reflective branch electrode under the second branch electrode, and
a reflective via electrode between the second via electrodes and the contact layer,
wherein the reflective via electrode surrounds a side surface of the second via electrodes.

20. The light emitting device of claim 18, further comprising an insulating layer on the contact layer,
wherein the second pad electrode contacts the contact layer by passing through the insulating layer.

* * * * *